(12) United States Patent
Rich et al.

(10) Patent No.: US 9,008,993 B2
(45) Date of Patent: Apr. 14, 2015

(54) METHODS AND APPARATUS FOR DETECTING UNAUTHORIZED BATTERIES OR TAMPERING BY MONITORING A THERMAL PROFILE

(75) Inventors: David Gerard Rich, Waterloo (CA); Jonathan Quinn Brubacher, Waterloo (CA); Matthew Michael Ignor, Stratford (CA)

(73) Assignee: BlackBerry Limited, Waterloo (CA)

( * ) Notice: Subject to any disclaimer, the term of this patent is extended or adjusted under 35 U.S.C. 154(b) by 497 days.

(21) Appl. No.: 13/330,266

(22) Filed: Dec. 19, 2011

(65) Prior Publication Data

US 2013/0158936 A1    Jun. 20, 2013

(51) Int. Cl.
*G01K 13/00*    (2006.01)
*G01R 22/06*    (2006.01)
*H01L 23/00*    (2006.01)

(52) U.S. Cl.
CPC .............. *G01K 13/00* (2013.01); *G01R 22/066* (2013.01); *H01L 23/57* (2013.01); *H01L 2924/00* (2013.01); *H01L 2924/0002* (2013.01)

(58) Field of Classification Search
CPC ...... G01K 13/00; G01R 22/066; H01L 23/57; H01L 2924/0002; H01L 2924/00
USPC ........ 702/5, 130, 131; 320/106; 361/704, 708
See application file for complete search history.

(56) References Cited

U.S. PATENT DOCUMENTS

| | | | |
|---|---|---|---|
| 4,388,582 A | | 6/1983 | Saar et al. |
| 5,399,446 A | | 3/1995 | Takahashi |
| 5,761,309 A | * | 6/1998 | Ohashi et al. ................. 713/156 |
| 7,250,612 B2 | * | 7/2007 | Pai-Paranjape et al. ... 250/461.1 |
| 7,292,441 B2 | * | 11/2007 | Smalc et al. .................. 361/704 |
| 7,506,183 B2 | * | 3/2009 | Araya ............................ 713/300 |
| 7,579,808 B2 | | 8/2009 | Haraguchi et al. |
| 7,683,571 B2 | * | 3/2010 | Takamatsu et al. ........... 320/106 |
| 8,140,294 B2 | * | 3/2012 | Ramey et al. ................. 702/131 |
| 8,225,111 B2 | * | 7/2012 | Bailey et al. .................. 713/300 |

(Continued)

FOREIGN PATENT DOCUMENTS

| | | |
|---|---|---|
| DE | 10134065 | 1/2003 |
| EP | 0546872 | 6/1993 |

(Continued)

OTHER PUBLICATIONS

European Patent Office, Extended European Search Report, for European Patent Application Serial No. 11194230.6, mailed Jun. 4, 2012.

(Continued)

*Primary Examiner* — Carol S Tsai
(74) *Attorney, Agent, or Firm* — Perry + Currier Inc.

(57) ABSTRACT

According to one aspect, a portable electronic device having a heat generating component, a thermal sensor, an energy storage device for powering the portable electronic device, a thermal element thermally coupled to the heat generating component, the energy storage device, and the thermal sensor. The thermal element is sized and shaped so that heat generated by the heat generating component flows through the thermal element towards the thermal sensor and interacts with the energy storage device. The thermal sensor is used to monitor a thermal profile for the thermal element, and the monitored thermal profile is compared with an expected thermal profile to determine if the integrity of the portable electronic device has been compromised.

19 Claims, 8 Drawing Sheets

(56) References Cited

U.S. PATENT DOCUMENTS

| | | | |
|---|---|---|---|
| 8,346,299 B2 * | 1/2013 | Dorsey et al. | 455/552.1 |
| 8,499,179 B2 * | 7/2013 | Bailey et al. | 713/300 |
| 2001/0052075 A1 * | 12/2001 | Feinberg | 713/168 |
| 2005/0270746 A1 * | 12/2005 | Reis | 361/708 |
| 2006/0108972 A1 * | 5/2006 | Araya | 320/106 |
| 2006/0144581 A1 * | 7/2006 | Kauf | 165/202 |
| 2007/0069153 A1 | 3/2007 | Pai-Paranjape et al. | |
| 2010/0091747 A1 * | 4/2010 | Dorsey et al. | 370/338 |
| 2010/0213890 A1 * | 8/2010 | Winger et al. | 320/106 |
| 2010/0309631 A1 | 12/2010 | Hill et al. | |
| 2013/0105138 A1 * | 5/2013 | Burchard et al. | 165/287 |

FOREIGN PATENT DOCUMENTS

| | | |
|---|---|---|
| EP | 11111377 | 6/2001 |
| EP | 2073292 | 6/2009 |

OTHER PUBLICATIONS

European Patent Office, Examiner's Report for European Patent Application Serial No. 11194230.6 mailed Jul. 5, 2013.

* cited by examiner

METHODS AND APPARATUS FOR DETECTING UNAUTHORIZED BATTERIES OR TAMPERING BY MONITORING A THERMAL PROFILE

FIELD

Embodiments herein relate to portable electronic devices, and in particular to methods and apparatus for detecting unauthorized batteries or tampering with the portable electronic device by monitoring a thermal profile.

INTRODUCTION

Portable electronic devices may provide various functions including telephonic functions, electronic messaging, web browsing, or other applications, (e.g. gaming, navigation, etc.). The term portable electronic device generally includes various types of devices, including cellular phones, smart phones, Personal Digital Assistants (PDAs), tablet computers, and so on. Some portable electronic devices may be handheld, that is, sized and shaped to be held or carried in a human hand.

Portable electronic devices are often powered by a battery or other energy storage device, such as a rechargeable battery. For example, a manufacturer or another authorized entity may provide an authorized battery suitable for use with the portable electronic device. However, the use of unauthorized or counterfeit batteries has now become quite common.

BRIEF DESCRIPTION OF THE DRAWINGS

Embodiments of the present disclosure will now be described, by way of example only, with reference to the attached figures, in which.

DETAILED DESCRIPTION OF SOME EMBODIMENTS

Experience has shown that some consumers are drawn to unauthorized batteries since they may be offered at a reduced cost (as compared to authorized batteries), or with a promise of improved performance (e.g. counterfeit batteries may claim to last longer). Other consumers may unknowingly purchase counterfeit batteries, being duped by unscrupulous distributors passing off their unauthorized batteries as genuine.

Unfortunately, the use of counterfeit batteries may impede the proper functioning of the portable electronic device. For example, some counterfeit batteries may be poorly manufactured and may use lesser quality materials, which can cause operational issues (e.g. charging problems) or battery failure, leading to a poor user experience. Furthermore, counterfeit batteries may be of a different mechanical or electrical design which can interfere with the operation of (or even damage) other components on the portable electronic devices. For instance, a counterfeit battery may draw too much current, leading to overheating of some components on the portable electronic device.

Further, the act of replacing an authorized battery with an unauthorized battery may cause damage to one or more components of the portable electronic device, particularly where the authorized battery is designed to be non-removable. In some cases tampering with a non-removable battery or other component can cause mechanical damage (e.g. a component may be broken as a battery is changed), electrical damage (e.g. due to electrostatic discharge), or other problems.

Also, it has been discovered that many counterfeit or unauthorized batteries do not meet recognized specifications (e.g. specifications set by the manufacturer, by an industry association, by a regulatory body, and so on). For example, rechargeable batteries or other energy storage devices may be qualified under specific standards to operate with a particular brand, type or configuration of portable electronic devices. In some cases, those standards may be intended to confirm that a particular battery will be able to handle electrical loads, thermal conditions, and other criteria associated with that portable electronic device.

Because of any one or more of several reasons, only some of which are mentioned above, an unauthorized battery may not satisfy these standards or may interfere with the proper operation of the portable electronic device, or both. This may lead to a poor user experience or even damage to the device. Accordingly, the use of unauthorized batteries is generally undesirable.

Some embodiments as described herein may be useful for detecting when a battery is counterfeit, such as when an original equipment manufacturer (OEM) battery or other authorized battery has been removed and replaced with an unauthorized battery.

Some embodiments as described herein may be useful for generally monitoring the integrity of the portable electronic device. This may be useful for determining whether the portable electronic device has been tampered with. For example, some embodiments as described herein may be adapted to detect when a non-removable battery or battery cover has been removed.

It has been discovered that different batteries may respond to similar thermal conditions in different manners. For example, some batteries may have a higher thermal conductivity (a property related to the rate of heat transfer through the battery), while others have a lower thermal conductivity. Furthermore, some batteries have different heat capacities, related to the quantity of heat that can be absorbed by the battery before a particular increase in temperature. It has been discovered that these thermal properties may be useful for distinguishing between different batteries.

In particular, according to some embodiments as described herein, a portable electronic device may have a thermal element that is thermally coupled to a battery, a heat generating component, and a thermal sensor. The term "thermally coupled" may include direct or indirect physical contact, which facilitates heat transfer via conduction, or a spaced apart relationship wherein heat transfer can occur via convection or radiation (or both).

As the heat generating component operates, heat is generated, often according to a predictable or known scheme. This generated heat will then flow through the thermal element towards the thermal sensor. As this happens, the heat will interact with and be affected by the thermal characteristics of the battery. This interaction affects the temperature of the thermal element.

The thermal sensor can then be used to record an observed thermal profile (e.g. a measurement of temperature vs. time) for the thermal element (e.g. in cooperation with a processor), and this thermal profile will depend on the thermal characteristics of the battery. Differences in the observed thermal profiles may indicate differences in the battery. For instance, variations in the observed thermal profile may be used to determine whether the battery is an unauthorized battery.

In particular, an observed thermal profile can be compared to an expected thermal profile that is associated with authorized batteries. If the observed profile falls outside of an expected range, the battery can be identified as "unauthorized".

In some embodiments, the thermal element may be tamper resistant. For example, the thermal element may be coupled to a component (e.g. the battery or battery cover) and designed to indicate when that component has been removed from the device.

In some cases, the thermal element may be adapted to experience damage (e.g. rip or tear) when that component is removed. This damage may impact the thermal characteristics of the thermal element, which can affect the thermal profile recorded using the thermal sensor. In such cases, variations in the observed thermal profile may indicate that the integrity of the portable electronic device has been compromised (e.g. a battery cover has been removed) even when a battery has not been tampered with.

Turning now to the figures, it will be appreciated that for simplicity and clarity of illustration, where appropriate, reference numerals may be repeated among the figures to indicate corresponding or analogous elements. In addition, numerous specific details are set forth in order to provide a thorough understanding of the example embodiments described. However, in some instances, well-known methods, procedures and components may not have been described in detail so as not to obscure some embodiments as described herein.

Figure 1:
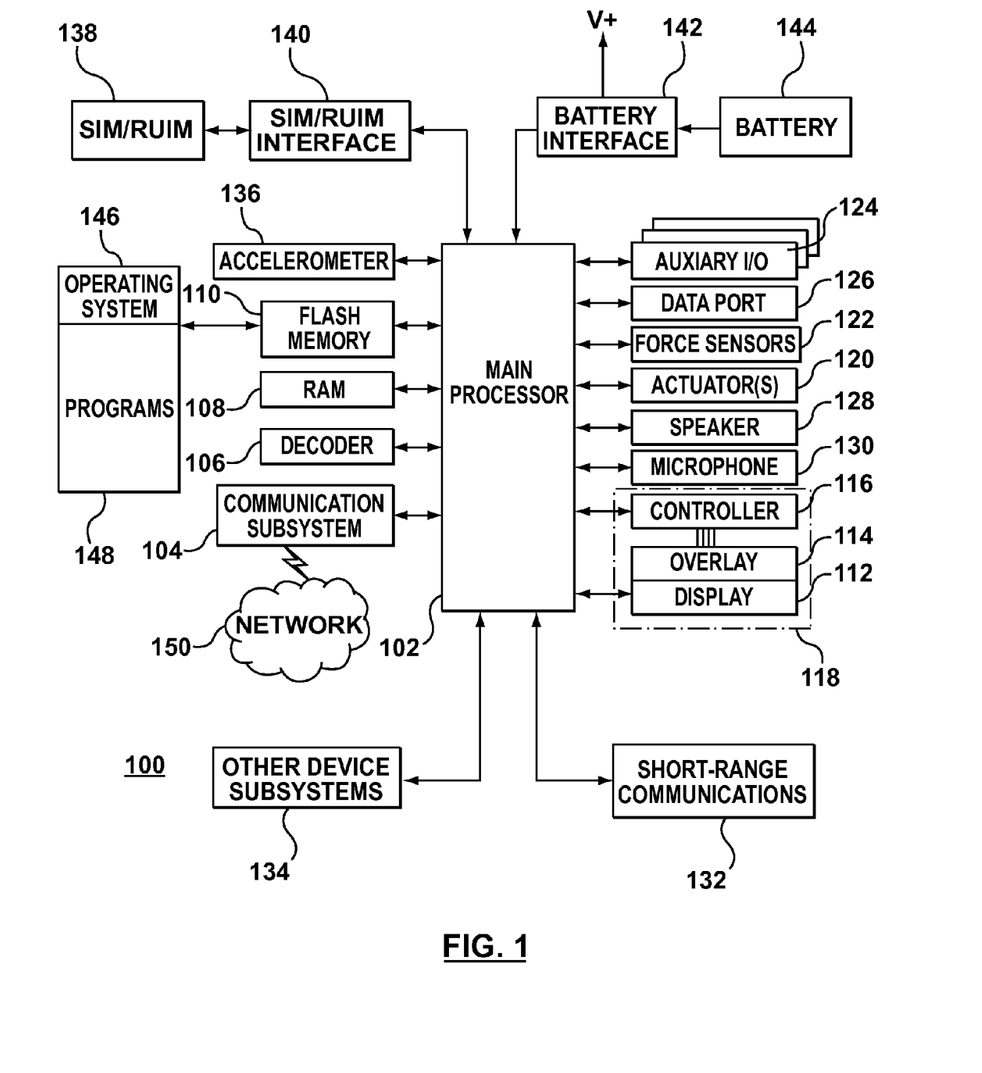
FIG. 1 is a simplified block diagram of components of a portable electronic device according to one embodiment.

FIG. 1 shows a simplified block diagram of components of a portable electronic device 100 according to one embodiment. The portable electronic device 100 includes a processor 102 that controls at least some operations of the portable electronic device 100. Communication functions, including data communications or voice communications (or both), may be performed through a communication subsystem 104. In some embodiments, data received by the portable electronic device 100 may be decompressed and decrypted by a decoder 106.

The portable electronic device 100 may be a battery-powered device and as shown may include a battery interface 142 for receiving one or more batteries 144 (which could be a rechargeable battery, and which may be removable or non-removable in various embodiments).

The communication subsystem 104 may receive messages from, and send messages to, a wireless network 150, for example using a radio. The wireless network 150 may be any type of wireless network, including, but not limited to, data-centric wireless networks, voice-centric wireless networks, and dual-mode networks that support both voice and data communications (for example a 3G or 4G network).

The processor 102 generally interacts with subsystem components such as a Random Access Memory (RAM) 108, a flash memory 110, and a display 112. Information, such as text, characters, symbols, images, icons, and other items may be displayed on the display 112.

The display 112 may have a touch-sensitive overlay 114 connected to an electronic controller 116 that together form a touch-sensitive display 118. In some embodiments, user-interaction with a graphical user interface may be performed through the touch-sensitive display 118.

Other components could include an actuator assembly 120, one or more optional force sensors 122, an auxiliary input/output (I/O) subsystem 124, a data port 126, one or more speakers 128, a microphone 130, a short-range communications module 132, an accelerometer 136, and other device subsystems 134.

In some embodiments, to identify a user as a subscriber for network access, the portable electronic device 100 may use a Subscriber Identity Module (SIM) or a Removable User Identity Module (RUIM) card 138 inserted into a SIM/RUIM interface 140. Alternatively, user identification information may be programmed into the flash memory 110, or via other techniques.

The portable electronic device 100 also generally includes an operating system 146 and software components 148 that are executed by the processor 102. The operating system 146 and software components 148 may be stored in a persistent data storage device, such as the flash memory 110.

In some embodiments, applications may be loaded onto the portable electronic device 100 through the wireless network 150, the auxiliary I/O subsystem 124, the data port 126, the short-range communications subsystem 132, or any other suitable device subsystem 134.

In use, a received signal such as a text message, an e-mail message, or web page download may be processed by the communication subsystem 104 and input to the processor 102. The processor 102 may then process the received signal for output to the display 112 or to the auxiliary I/O subsystem 124 (or both). In some embodiments, a user may compose data items, such as e-mail messages, which may be transmitted over the wireless network 150 through the communication subsystem 104.

For voice communications, the overall operation of the portable electronic device 100 may be similar. For example, the speaker 128 may output audible information converted from electrical signals, and the microphone 130 may convert received audible information into electrical signals for processing.

In some embodiments, one or more of the functional components as shown in FIG. 1 may be implemented on a printed circuit board (PCB), such as the printed circuit board 246 described herein below.

Figure 2:
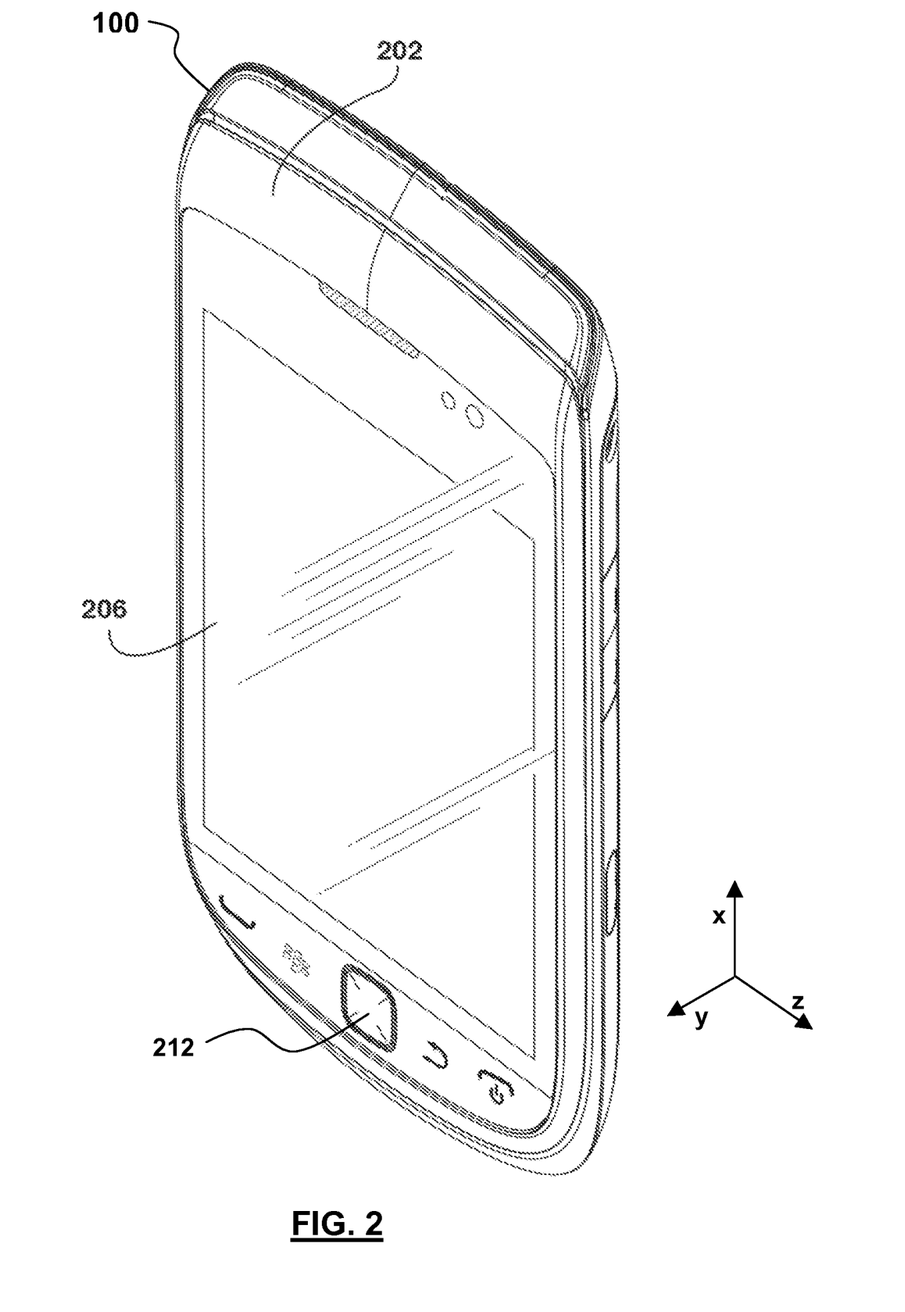
FIG. 2 is a front perspective view of the portable electronic device.

Turning now to FIG. 2, illustrated generally therein is a front perspective view of the portable electronic device 100 according to one embodiment. As shown, the portable electronic device 100 has a housing 202 that generally includes at least some of the functional components therein (e.g. the processor 102, the RAM 108, etc.). The housing 202 also supports a display 206. The display 206 could be an LCD or other suitable display, and may be a touch screen (e.g. the touch screen display 118) for receiving user input.

In some embodiments, the portable electronic device 100 may include one or more additional input devices, such as navigation keys or buttons, a physical keyboard or keypad, a trackpad, multimedia keys, and the like. For example, the housing 202 in this embodiment includes an auxiliary input device 212. The auxiliary input device 212 may be an optical navigation module that may be used for navigating around the display screen 206, to select objects, and so on.

The housing 202 may also include other input devices, such as a dedicated phone application button, a disconnect call button, a home screen button, and the like. In various embodiments, these input devices may include optical sensors, mechanical buttons, or both.

In some embodiments the portable electronic device 100 may include a keypad or keyboard that includes a plurality of alphanumeric keys, which may be positioned in a plurality of rows and columns. In some embodiments, the keys may represent an alphabet and may be arranged in a standard keyboard layout (e.g. QWERTY, QWERTZ, DVORAK, etc.).

It will be appreciated that the portable electronic device 100 may have various other shapes and configurations.

Figure 3:
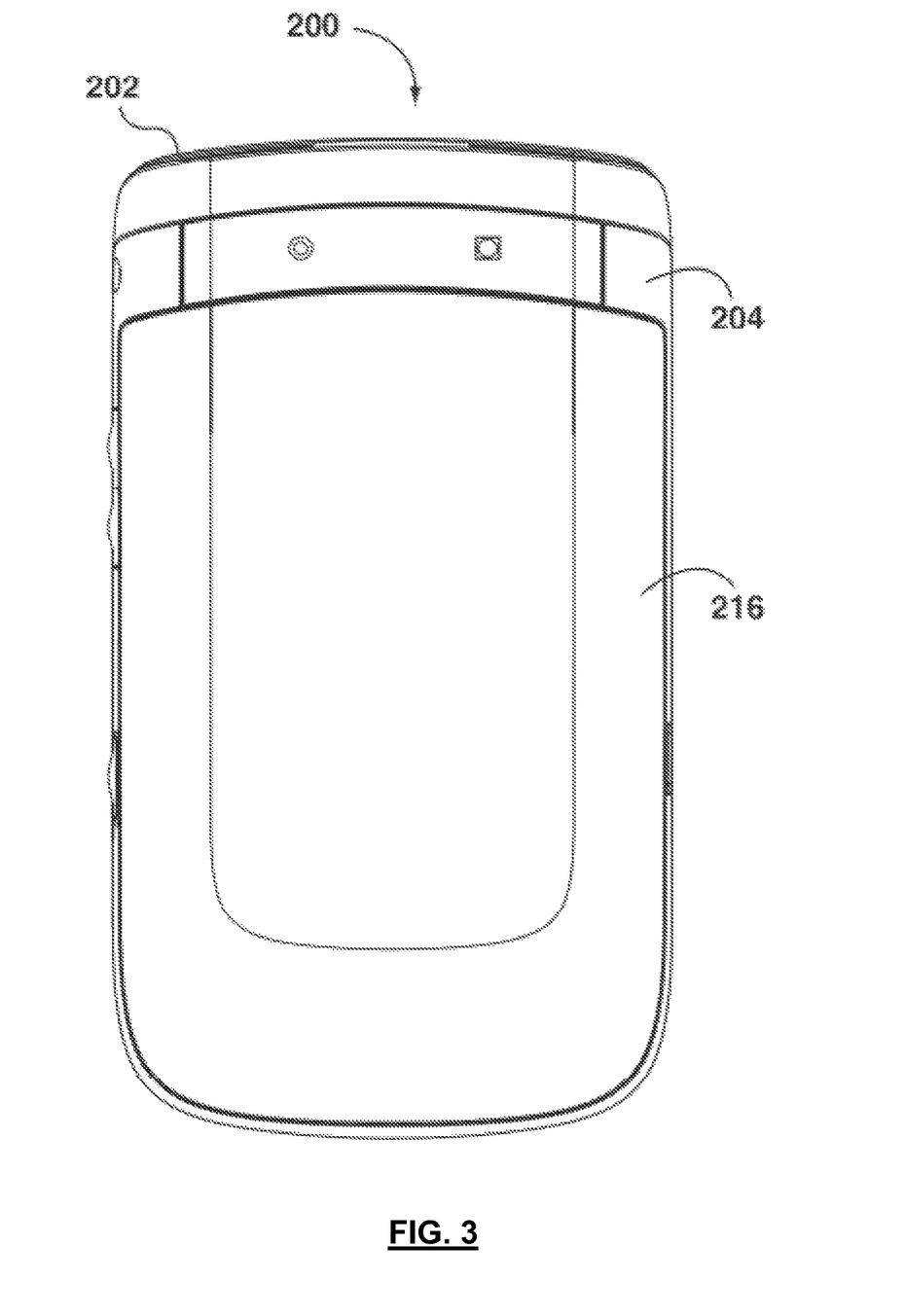
FIG. 3 is a rear view of the portable electronic device showing a battery cover.
Figure 4:
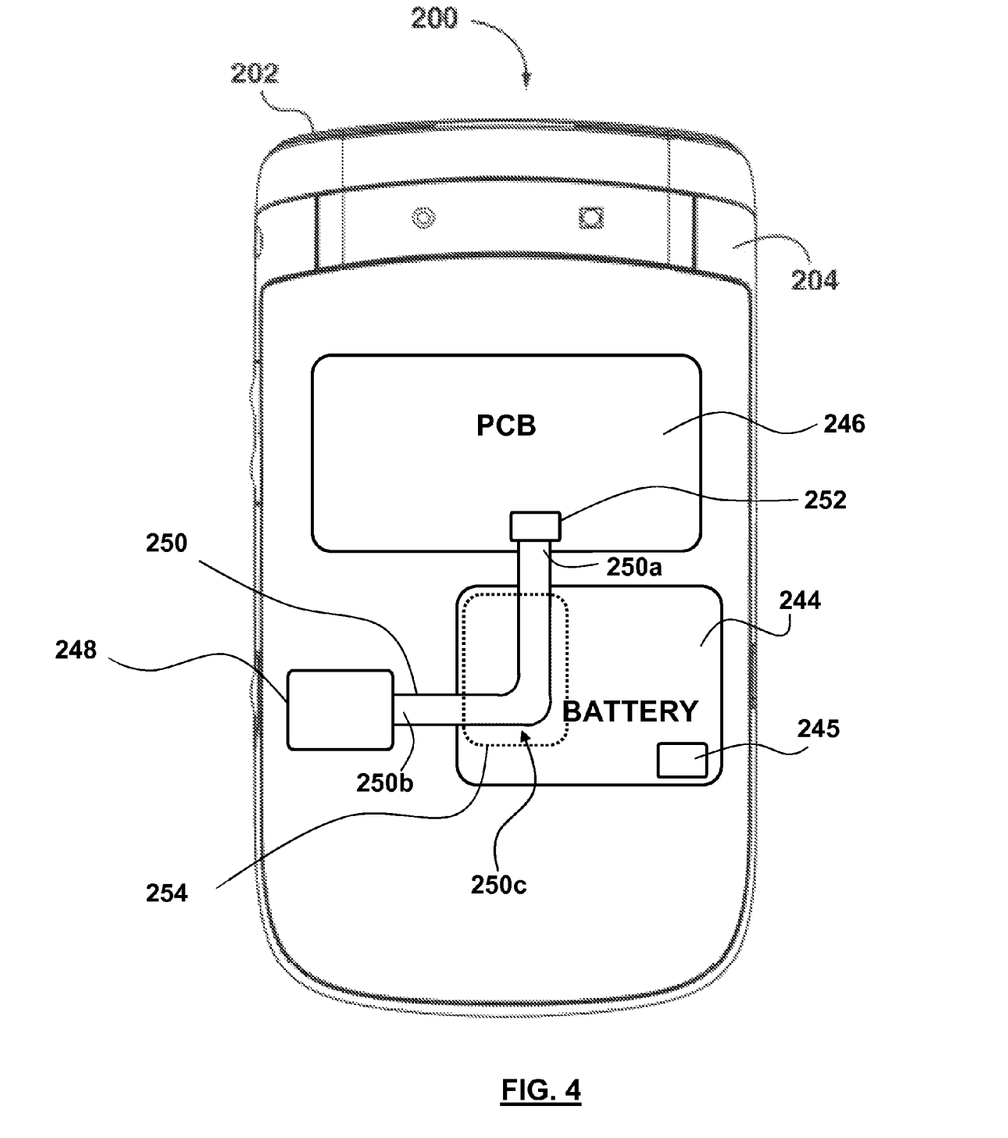
FIG. 4 is a rear view of the portable electronic device showing the battery cover removed and a battery and thermal element according to one embodiment.

Turning now to FIG. 3, illustrated therein is a rear view of the portable electronic device 100. As shown, the housing 202 of the portable electronic device 100 includes a rear housing portion 204. Coupled to the rear housing portion 204 is a battery cover 216. Generally the battery cover 216 is sized and shaped to cover a battery 244 (or other energy storage device) as shown in FIG. 4. In some embodiments, the battery 244 could be the battery 144 described above.

In some embodiments, the battery cover 216 may be removable. In particular, the battery cover 216 may be configured so that a user can remove the battery cover 216 to access the battery 244 or other components of the portable electronic device 100 (e.g. a SIM/RUIM card 138). This may be desirable where the battery 244 is designed to be removable. In other embodiments, the battery cover 216 may be non-removable.

As shown in FIG. 4, the portable electronic device 100 also includes a printed circuit board (PCB) 246, a heat generating component 248, and a thermal element 250. Although visible in FIG. 4, it will be appreciated that in some embodiments, one or more of the PCB 246, the heat generating component 248, and the thermal element 250 may be hidden from view even when the battery cover 216 is removed.

In some cases, the PCB 246 may include one or more of the functional components as described in FIG. 1 (e.g. RAM 108, memory 110, etc.). Furthermore in this embodiment the PCB 246 also includes a thermal sensor 252. The thermal sensor 252 is thermally coupled to a first end 250a (or first portion) of the thermal element 250. As described herein, the thermal sensor 252 can be used to record the temperature of the first end 250a to record an observed thermal profile of the thermal element 250. In particular, data from the thermal sensor 252 may be received by a processor (e.g. the processor 102) and then stored in a data storage device (e.g. a memory device such as the RAM 108 or flash memory 110).

In some embodiments, the first end 250a of the thermal element 250 may be thermally coupled to the thermal sensor 252 by physical contact so that heat from the thermal element 250 can flow to the thermal sensor 252 via conduction. In other embodiments, the first end 250a of the thermal element 250 may be spaced apart from the thermal sensor 252 and positioned so that heat from the thermal element 250 flows to the thermal sensor 252 via convection or radiation (or both).

In some embodiments, the thermal sensor 252 could be a thermistor whose resistance varies with temperature. In other embodiments, the thermal sensor 252 could be another type of sensor.

As also shown in FIG. 4, a second end 250b (or second portion) of the thermal element 250 is thermally coupled to the heat generating component 248. As with the thermal sensor 252, the thermal coupling may include physical contact (to facilitate conduction) or a spaced apart relationship that facilitates convection or radiation (or both).

In some embodiments, the heat generating component 248 could be a battery charger for charging the battery 244, a radio, a power amplifier, or another suitable component.

As also shown in FIG. 4, a portion 250c of the thermal element 250 is thermally coupled to the battery 244. As with the thermal sensor 252 and heat generating component 248, the thermal coupling between the thermal element 250 and the battery 244 may include physical contact (to facilitate conduction) or a spaced apart relationship that permits convection or radiation (or both).

As shown, in this embodiment the portion 250c of the thermal element 250 in contact with the battery 244 is between the two ends 250a, 250b of the thermal element 250. In other embodiments, the configuration and arrangement of the portions and ends of the thermal element 250 can be varied.

During use, heat is generated as the heat generating component 248 operates, often according to a known or predictable scheme. For example, when the heat generating component 248 is a battery charger, the act of charging (e.g. using a USB charger, a wall plug charger, etc.) will generate an amount of heat according to a pattern that may be related to the charging voltage.

This generated heat will flow from the second end 250b along the thermal element 250 towards the first end 250a at the thermal sensor 252. Moreover, as briefly discussed above, due to the thermal coupling between the battery 244 and the thermal element 250, this generated heat will interact with the battery 244.

The effect of the thermal interaction between the battery 244 and the thermal element 250 may depend on the thermal characteristics of the battery (e.g. the battery's temperature, thermal conductivity, heat capacity, etc.) and will impact the resulting temperature of the first end 250a of the thermal element 250. This in turn affects the resulting thermal profile that is recorded by the thermal sensor 252.

For example, in some embodiments the battery 244 may act as a heat sink, and draw heat away from the thermal element 250. In other embodiments, the battery 244 may act as a heat source, and add heat to the thermal element 250.

In some embodiments, if the battery 244 has a high thermal conductivity and is cooler than the thermal element 250, the battery 244 may tend to quickly draw heat away from the thermal element 250, cooling the first end 250a. Conversely, if the battery 244 is cooler than the thermal element 250 but has a low thermal conductivity, the battery 244 may draw heat away from the thermal element 250 much more slowly, allowing the first end 250a to heat up more quickly.

The thermal characteristics of the battery 244 thus tend to act as a "signature", with different batteries tending to impact the heat transfer through the thermal element 250 in a different manner, and thus resulting in different thermal profiles for the same or similar operating conditions.

In some embodiments, by comparing the observed thermal profile with an expected thermal profile associated with an approved battery, a determination can be made as to whether the battery is an authorized battery or an unauthorized battery.

In effect, monitoring the thermal profile of the thermal element 250 can allow a determination to be made as to whether the battery 244 "looks" like (or "behaves" like) an approved battery. If the observed thermal profile does not correspond to the thermal profile expected for an approved battery, then this suggests that the battery 244 is an unauthorized battery.

In some embodiments, the comparison between the observed thermal profiles and expected thermal profiles may be performed by a processor (e.g. the processor 102).

In some embodiments, the heat generated by the heat-generating component 248 is waste heat that is redirected and used to monitor the integrity of the portable electronic device 100. In this manner, the waste heat may be put to productive use. Furthermore, the integrity of the portable electronic device 100 can be monitored in a passive way without needing to actively power a complicated sensor system.

In some embodiments, the temperature of the battery 244 may be monitored (e.g. using a battery temperature sensor 245). Monitoring the temperature of the battery 244 may further help in determining whether the battery 244 is authorized, as battery temperature may change the thermal characteristics of the battery 244.

Generally the size and shape of the thermal element 250 can be varied according to the particular arrangement and configuration of the portable electronic device 100. For example, in some embodiments, the thermal element 250 could be an L-shaped heat spreader made of a thin, thermally conductive material (e.g. a foil of copper or aluminum, a sheet of graphite, a thermally conductive compressible foam, etc.).

Furthermore, the position of the thermal element 250 relative to components such as the battery 244 and heat generating component 248 can also change. For example, in some embodiments, the thermal element 250 may be located above the battery 244 (e.g. between the battery 244 and the battery cover 216, as shown in FIG. 4). This may make it more difficult to remove the battery 244 without disturbing the thermal element 250, particularly where the thermal element 250 incorporates one or more tamper resistant features. However, the thermal element 250 may be more readily visible.

Figure 5:
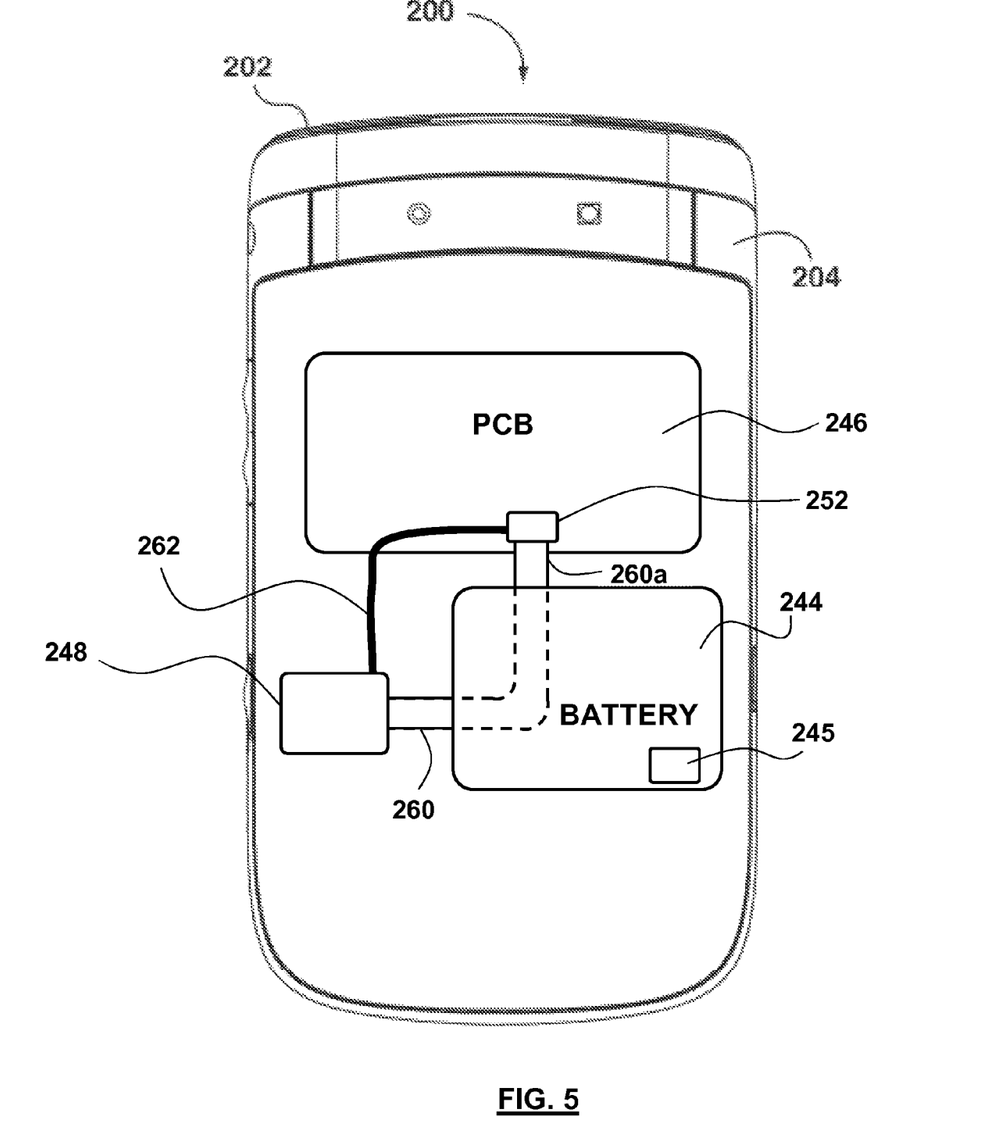
FIG. 5 is a rear view of the portable electronic device showing the battery cover removed and a battery and thermal element according to another embodiment.

In other embodiments, the thermal element may be located below the battery 244 (e.g. with the battery 244 between a thermal element 260 and the battery cover 216, as shown in FIG. 5 for example). This may be useful for hiding the thermal element 260.

In some embodiments, the thermal element 250 may be tamper resistant. For example, the thermal element 250 may be coupled to one or more components (e.g. the battery 244, the battery cover 216, the heat generating component 248, the PCB 246, etc.) and designed to resist or at least indicate removal thereof. For instance, the thermal element 250 may be secured to one or more components using an adhesive, some form of mechanical coupling, or via other techniques.

In some cases the thermal element 250 may be adapted to experience damage (e.g. rip or tear) when a particular component is tampered with (e.g. when the battery 244 or battery cover 216 are removed from the portable electronic device 100). This damage may impact the thermal characteristics of the thermal element 250, which can also affect the thermal profile observed by the thermal sensor 252. In such cases, variations in the observed thermal profile may indicate that the integrity of the portable electronic device 100 has been compromised (e.g. the non-removable battery cover has been removed).

This may be useful for detecting tampering of a non-removable battery by an unauthorized person (e.g. the user, an unapproved repair shop, etc.). In some cases, tampering can damage the battery 244, which can lead to latent failures. Tampering may also be relevant to the status of a warranty for the portable electronic device 100, as tampering is often considered to void a warranty. Accordingly, it may be desirable to know whether the device 100 has been tampered with, particularly if a component has been damaged and the portable electronic device 100 is being repaired.

Returning again to FIG. 4, in some embodiments, at least a portion of the thermal element 250 (e.g. the portion 250c) may be covered by a concealment member 254 (e.g. a sticker, a label, etc.). This may inhibit a user from readily observing the thermal element 250. This can be useful since a user who is aware of the thermal element 250 may be more likely to try and repair or replace the thermal element 250 so that any tampering with the device 100 will not be detected.

In some embodiments, the concealment member 254 may assist in securing the thermal element 250 to the battery 244 or to another component, which may assist in providing the thermal element 250 with some tamper resistance.

As discussed above, the heat generating component 248 may include various components, for example a battery charger, a radio, a power amplifier, and so on. Different types of components may be more or less suitable for use as the heat generating component 248. In particular, it may be desirable that the heat generating component 248 provide a stable and predictable heat signature or scheme. For instance, both a power amplifier and radio tend to be dynamic and provide unpredictable thermal outputs due to variations in their operating characteristics.

On the other hand, a battery charger tends to be more stable and predictable, particularly since the charging current is generally known, which can allow for more accurate estimates to be made of the heat output therefrom. This can in turn help provide a more accurate expected thermal profile for the current operating conditions of the device 100, which may result in a more accurate determination overall as to whether the battery 244 is authorized or if the device 100 has been tampered with.

As discussed above, in some embodiments the thermal sensor 252 may be a thermistor. This may be beneficial as a thermistor tends to provide for relatively stable and accurate sensor readings, which may help improve the accuracy of the observed thermal profile. Moreover, the thermistor may look like a surface mount resistor, which can make it difficult for the user to detect the function of the thermal sensor 252. This may be particularly beneficial when it is desired that the monitoring of the thermal element 250 be hidden from the user.

In some embodiments, the thermal element 250 need not be a separate heat spreader or other element, but could be integrally formed with one or more other components. For example, in some cases the thermal element 250 could be a portion of the battery 244, a portion of the battery cover 216, provided as a portion of the battery interface 142, embedded in the PCB 246, and so on. In such cases, the thermal profile observed by the thermal sensor 252 may provide an indication when the thermal element 250 is absent (e.g. where the thermal element 250 is integral to an approved battery, replacing the approved battery with an unapproved battery may remove the thermal element 250 from the device 100, which will change the resulting thermal profile recorded by the thermal sensor 252).

Turning now to FIG. 5, and as briefly discussed above, in some embodiments the thermal element 260 may be located below the battery 244 (e.g. with the battery 244 between the thermal element 260 and the battery cover 216). This may further facilitate hiding the presence or operation of the thermal element 260 from the user.

As also shown in FIG. 5, in some embodiments a reference element 262 may be used to directly couple the thermal sensor 252 to the heat generating component 248, generally without interacting with the battery 244. In particular, the reference element 262 may be thermally isolated from the battery 244 (and in some cases from other heat generating elements within the portable electronic device 100) so that the temperature of the heat generating component 248 may be more directly observed by the thermal sensor 252.

This may provide a reference temperature that reflects the current temperature of the heat generating component 248, which can then be compared to the observed temperature of the portion 260a of the thermal element. This may provide for a more accurate estimate of the thermal impact of the battery 244 on the temperature of the thermal element 260.

Figure 6:
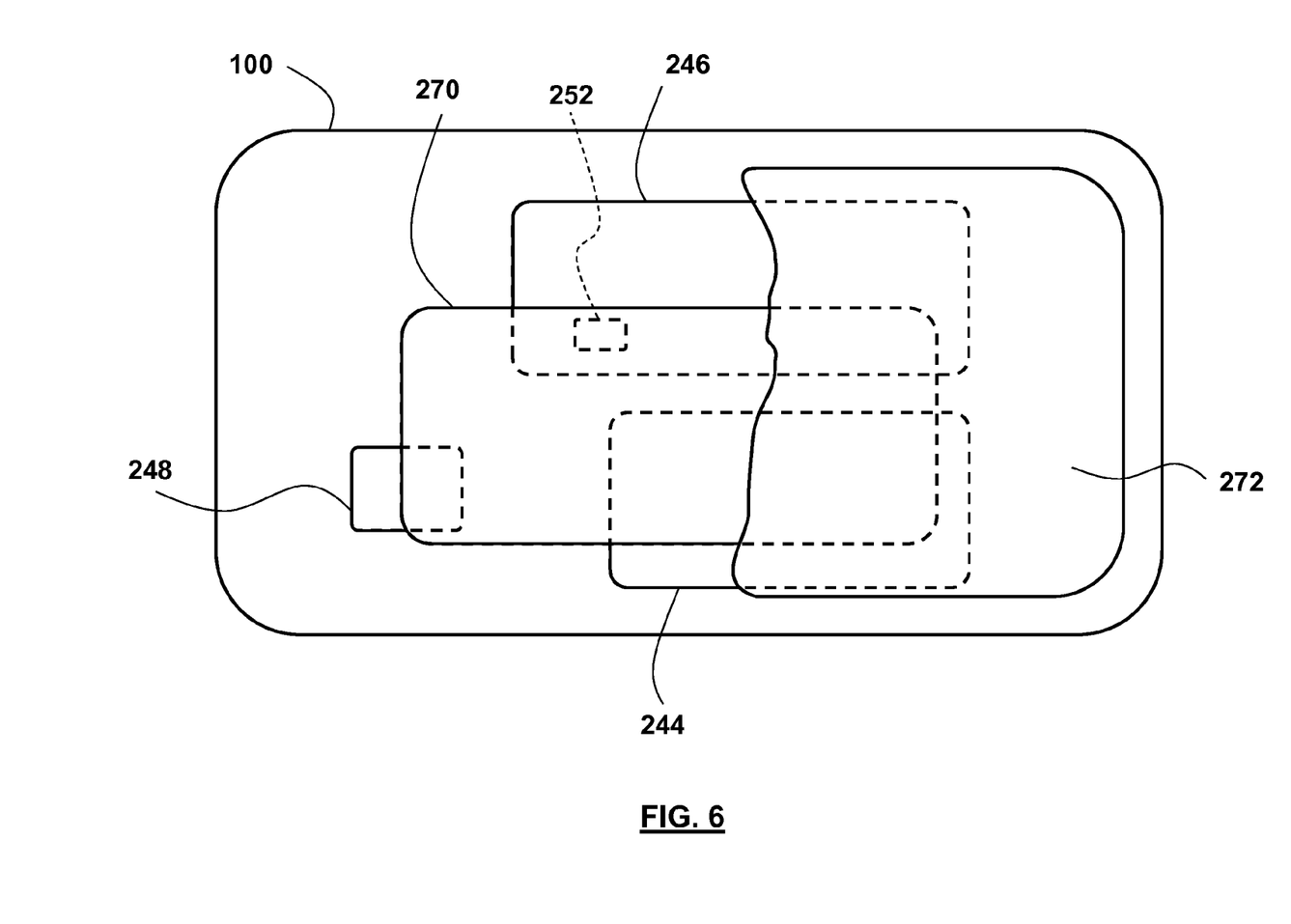
FIG. 6 is a schematic illustration of another portable electronic device with a battery, a thermal element, and a non-removable battery cover.

Turning now to FIG. 6, illustrated therein is an embodiment with a thermal element 270 having a different size and shape. In particular, the thermal element 270 has a generally rectangular shape (as opposed to the L-shaped thermal element 250 shown in FIG. 4).

This embodiment also includes a non-removable battery cover 272 (shown partly omitted for clarity). For example, the battery cover 272 may be affixed to the portable electronic device 100 in a manner designed to inhibit the user from removing the battery cover 272 (e.g. using adhesive, locking mechanical tabs, or other techniques). This may be beneficial when it is undesirable that the user access the battery 244.

In this embodiment the thermal element 270 may be permanently affixed to the battery cover 272, such that if the battery cover 272 is removed, the thermal element 270 may be damaged and thus will behave thermally in a different manner. In such cases, even if the battery cover 272 is reattached to the portable electronic device 100, the observed thermal profile at the temperature sensor 252 may be different, and thus the tampering may be detectable.

Figure 7:
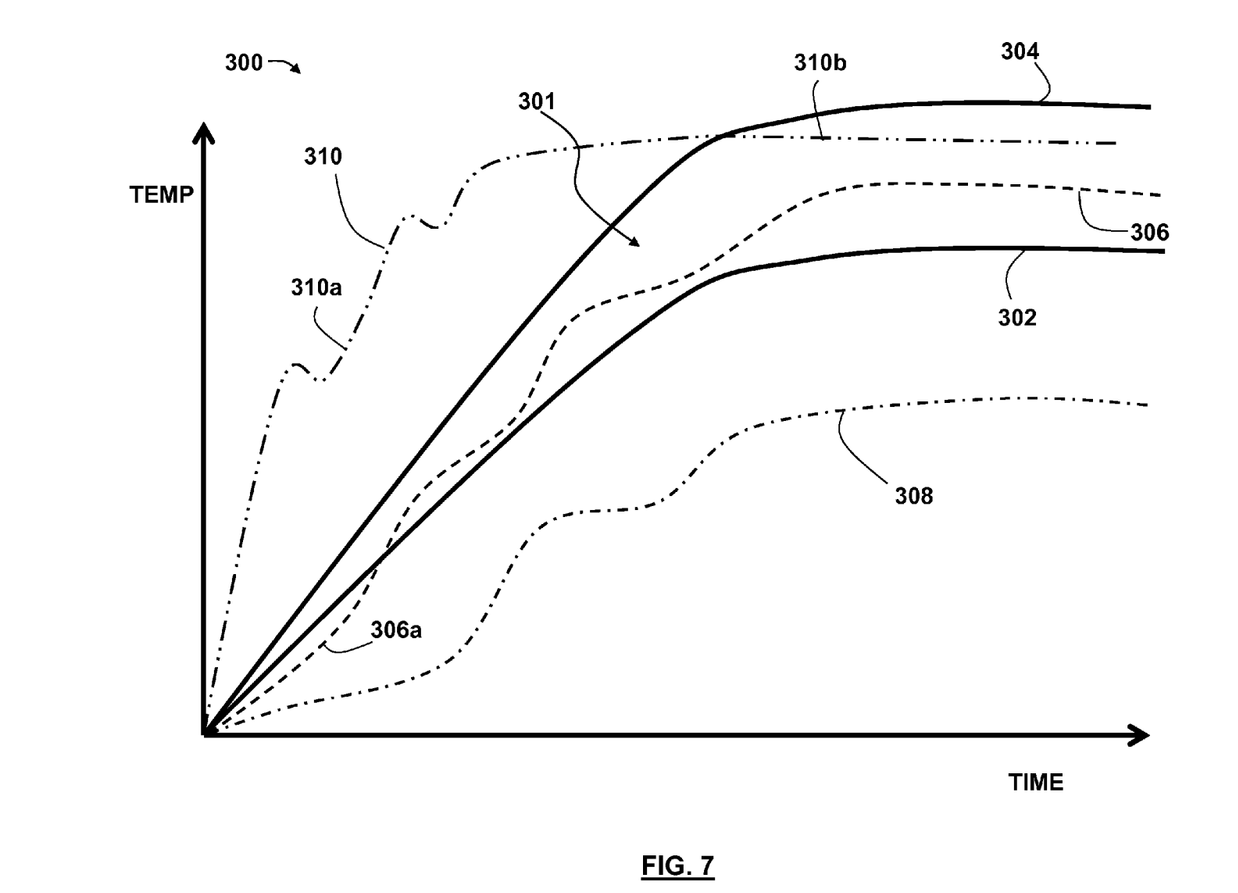
FIG. 7 is a graph illustrating several monitored thermal profiles and an expected thermal profile.

Turning now to FIG. 7, illustrated therein is a graph 300 showing exemplary monitored thermal profiles and an expected thermal profile. In particular, the graph 300 shows an expected thermal profile 301 that is defined (in this embodiment) as a region between a lower threshold curve 302 and an upper threshold curve 304.

Defining the expected thermal profile 301 between upper and lower thresholds 304, 302 allows the portable electronic device 100 to compensate for errors or variability that may occur when monitoring the thermal profile, for example to avoid erroneous determinations that a battery is unauthorized and so on. For instance, sources of error could include tolerances of the temperature sensors (e.g. the thermal sensor 252, the battery temperature sensor 245), temperature variations in thermal characteristics of various components (e.g. the battery 244, the thermal element 250), and other items (e.g. variations in current sources, ambient temperatures, humidity, etc.).

In some embodiments, the expected thermal profile 301 may be a predetermined or pre-calculated profile based on expected operating conditions (e.g. operating conditions that would normally be expected during a charging event, for example). For example, a library of expected thermal profiles could be developed for various operating conditions and stored in a data storage device (e.g. a memory). This approach may be relatively efficient from a processing perspective, as a monitored thermal profile can be compared to a stored expected thermal profile.

In other embodiments, the expected thermal profile 301 may be calculated dynamically based on actual observations of the operating conditions of the portable electronic device 100. For example, the expected thermal profile 301 may be determined based on a current temperature of the battery 244 (e.g. as measured by the battery temperature sensor 245), a current temperature of the heat generating component 248 (e.g. using the reference element 262), based on ambient temperatures, humidity, and so on. This may be computationally more intense (and may require monitoring and updating of the expected thermal profile 301), but may provide for more accurate results.

Generally, a monitored or observed thermal profile that falls within the threshold curves 302, 304 will be considered to satisfy or correspond to the expected thermal profile 301. For example, as shown a first observed thermal profile 306 falls between the threshold curves 302, 304 and thus within the expected thermal profile 301 (except for a small first portion 306a thereof which is below the lower threshold curve 302). This strongly suggests that the integrity of the portable electronic device 100 is valid, and in particular is evidence that the battery is an approved battery, and that the thermal element is present and has not been damaged by tampering.

In some embodiments, small irregularities in the observed thermal profile (e.g. the first portion 306a being below the threshold curve 302) can be disregarded where considered appropriate based on factors such as their magnitude and duration. For example, in some embodiments an observed thermal profile may be considered to correspond to an expected thermal profile if at least 90% of the observed thermal profile is within the upper and lower threshold 302, 304.

As also shown in FIG. 7, a second observed thermal profile 308 is shown entirely below the lower threshold curve 302, outside of the expected thermal profile 301. This indicates that something the integrity of the device 100 may have been compromised. For example, this second observed thermal profile 308 may suggest that the battery is an unauthorized battery, that the thermal element has been tampered with (e.g. a battery cover may have been removed), or that the thermal element may have even been removed entirely (e.g. where the thermal element is integral to an authorized battery).

Similarly, a third observed thermal profile 310 is also indicative that something undesirable has occurred, as a significant portion 310a of the third observed thermal profile 310 is above the upper threshold curve 304 and outside the expected thermal profile 301 (even though a second portion 310b of the third observed thermal profile 310 falls within the expected thermal profile 301). Once again, this may be indicative that the battery is an unauthorized battery, that the device has been tampered with, and so on.

In some embodiments, different specific features of the thermal profiles 306, 308, 310 can be compared to the expected profile to determine whether there is a match. For example, features such as the rate of change of temperature (e.g. the slope), a steady-state or maximum temperature, and a time taken to reach the steady-state or maximum temperature can be compared. In particular, in some embodiments different specific features may be used to try and determine what events have occurred to compromise the integrity of the device 100 (e.g. whether an unauthorized battery, tampering with the thermal element, a missing thermal element, and so on).

In some embodiments, the portable electronic device 100 can record an error log indicative of when the integrity of the device 100 appears to have been compromised. In some embodiments, this error log can be stored on the portable electronic device 100 so that it can be accessed (if desired) during a repair or inspection. In some embodiments, a warning message or other alert about the compromised integrity may be provided to the user, for example as an indication that they may have inadvertently inserted an unauthorized or counterfeit battery.

In some embodiments, this error log or other information can be transmitted by the portable electronic device 100 to a wireless service provider, to the manufacturer, or to another entity. In some embodiments, this may be used to initiate a follow up event (e.g. a customer service representative may contact the user of the portable electronic device 100 warning them that they have an unauthorized battery or that their device has been tampered with).

Figure 8:
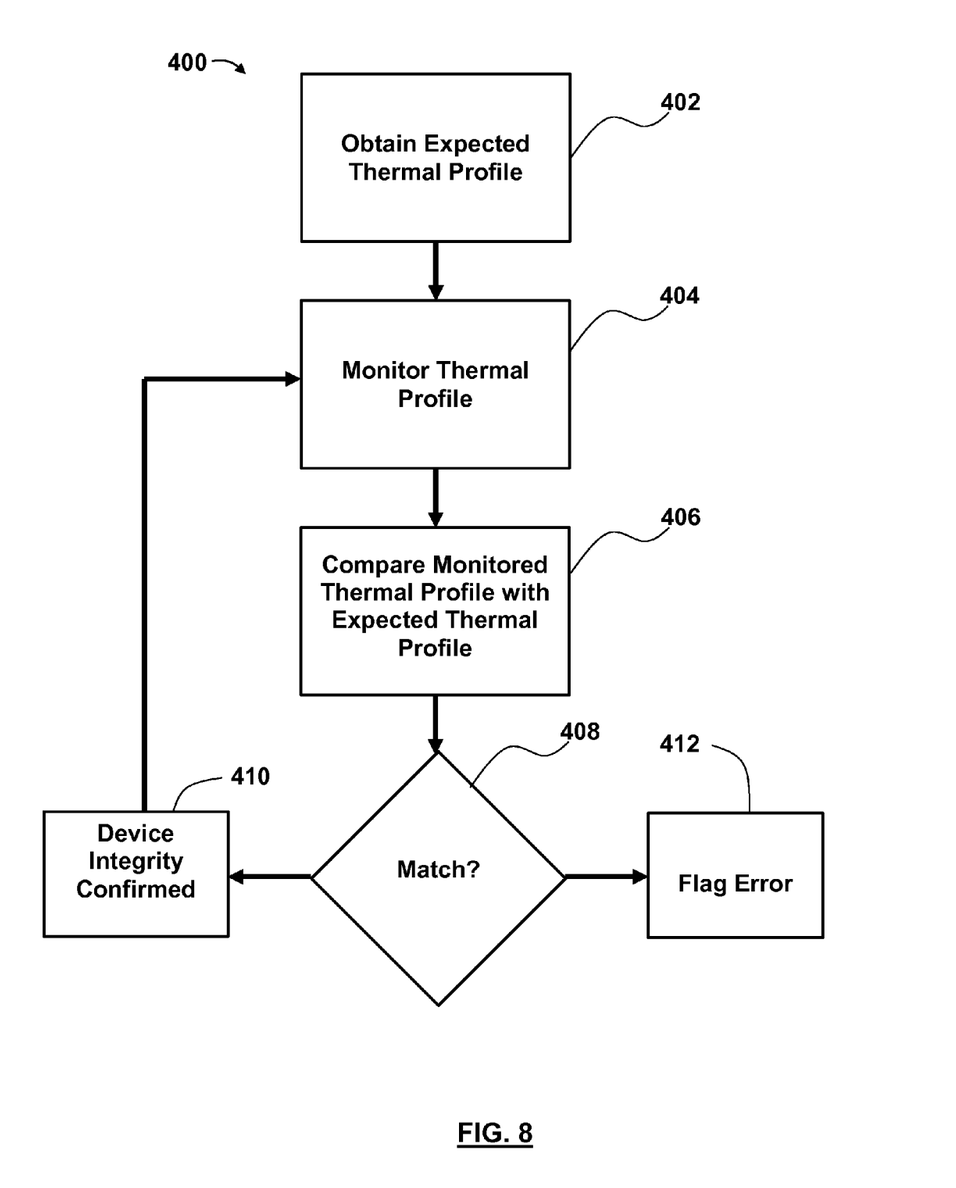
FIG. 8 is a flowchart of a method of monitoring the integrity of a portable electronic device using a thermal profile according to some embodiments.

Turning now to FIG. 8, illustrated therein is a method 400 of monitoring the integrity of a portable electronic device according to some embodiments.

At step 402, an expected thermal profile is obtained. In some embodiments, this expected thermal profile could be predetermined based on expected operating conditions. In other embodiments, this thermal profile could be calculated based on observed operating conditions for the portable electronic device.

At step 404, a thermal sensor is used to monitor a temperature at a specific location. In particular, a series of temperature measurements may be taken by the thermal sensor and used to generate an observed thermal profile.

At step 406, the observed thermal profile is compared to the expected thermal profile. For example, the observed thermal profile may be stored in a memory and compared to the expected thermal profile using a processor (e.g. the processor 102).

At step 408, a determination is made whether the observed thermal profile corresponds to the expected thermal profile. If the profiles match (in some cases within some particular confidence level, e.g. 90%), then the method 400 proceeds to step 410 and the integrity of the device is confirmed. In particular, this may indicate that the battery in the device is an authorized battery, and that no tampering with the device has been detected. The method 400 may then return to step 404 where a thermal profile can continue to be monitored.

However, if at step 408 there is no match, then the method 400 proceeds to step 412 and an error can be flagged indicating that the integrity of the device appears to have been compromised. In particular, at step 412 an indication may be made that the battery appears to be an unauthorized battery, or that the device appears to have been tampered with, or that a thermal element appears to be missing, and so on. In some embodiments, further processing may be performed after step 412 to determine which event has occurred that resulted in the compromised integrity.

Optionally, when an error has been flagged, and after such further processing has been performed, additional action may be taken. The action may represent an overt action that may be observable by, or may be noticeable to, a user. The action may be of any kind, but the following are examples of additional action that may be taken, individually or in concert. The portable electronic device may be automatically turned off. For example, the device may be automatically inhibited from turning on or for staying on for an extended interval. Some functionality of the device may be automatically disabled. A visual, auditory or tactile warning may be presented to a user (some examples are discussed below). The device may automatically operate on lower power or at slower speed. The device may automatically activate a cooling system or heat management system.

In some embodiments, one or more teachings herein may be used to detect whether a portable electronic device is operating within a desired thermally acceptable temperature range. In particular, one or more thermal sensors (e.g. the thermal sensor 252) may be configured to expect a certain range of temperatures depending on the operating characteristics of a portable electronic device.

The thermal sensor could identify conditions that exceed particular temperature thresholds (e.g. a high temperature condition or a low temperature condition), and in response the device may enable or disable particular components (particularly heat generating components, e.g. the processor, camera flash) to adjust the temperature of the device. For instance, the portable electronic device may slow the speed of the processor, disable a camera flash, decrease the charging rate of a charger, and so on to reduce temperature of the portable electronic device.

In some embodiments, the portable electronic device may adjust the expected thermal profile according to what components of the device are active, what components are deactivated, and the overall temperature of the device.

In some embodiments, when the thermal sensor identifies conditions that exceed particular temperature thresholds, one or more components could be deactivated to protect the device (e.g. powering down the battery, limiting radio transmission, etc.). Moreover, the user may be warned that the device may be operating with limited performance, and suggest taking appropriate action to correct the condition (e.g. contacting a service technician, etc.).

Although embodiments herein are described with reference to batteries, in some cases the teachings herein could be used with other components, such as other types of energy storage devices (e.g. a fuel cell), or more generally to authenticate other types of components in a portable electronic device (e.g. a memory chip, a processor, etc.) and to detect tampering therewith.

Implementation of one or more embodiments may realize additional benefits as well. Not only may the concepts described herein recognize or distinguish authorized or unauthorized batteries, detection as a function of thermal characteristics may represent a direct detection of a potential hazard, and may further be used to treat a malfunctioning battery as an unauthorized battery. Colloquially speaking, overheating can be a hazard, and monitoring a thermal profile may be one way to detect and manage the hazard.

In addition, the concepts described herein may be used to supplant, or operate in concert with, other techniques for detection of unauthorized components or overheating.

Further, the concepts described herein are versatile and may be applied to a variety of energy storage devices or portable electronic devices. In the case of handheld devices, in which considerations of size and weight are important, the concepts may be beneficial in that they may be implemented with little—perhaps negligible—need for additional size or weight. Further, the concepts described herein may be implemented in a relatively cost-effective manner.

Some embodiments herein have referred to a portable electronic device that includes a housing, a touch-sensitive display exposed by a front of the housing, and functional components including memory and a processor coupled to the memory and the touch-sensitive display. However, the teachings herein are not limited to touchscreen devices, but may apply to other types of portable electronic devices such as candybar or slab devices, clamshell or flip devices, swivel devices, and various combinations thereof. In particular, in some examples, the devices may include a keypad and touchscreen, and may include one or more auxiliary buttons, or may include a touchscreen without a keypad. Furthermore, in some embodiments the teachings herein may be used for tablet computing devices.

While the above description provides examples of one or more processes or apparatuses, it will be appreciated that other processes or apparatuses may be within the scope of the accompanying claims.

The invention claimed is:

1. A portable electronic device, comprising:
   a heat generating component;
   a thermal sensor;

a battery for powering the portable electronic device;

a thermal element thermally coupled to the heat generating component, the battery, and the thermal sensor, the thermal element sized and shaped so that heat generated by the heat generating component flows through the thermal element towards the thermal sensor and interacts with the battery; and a processor operationally coupled to the thermal sensor to monitor a thermal profile for the thermal element, the processor configured to compare the monitored thermal profile with an expected thermal profile to determine if the battery is an authorized battery.

2. The portable electronic device of claim 1, wherein the thermal element is coupled to at least one component and is tamper resistant to indicate when that component has been removed.

3. The portable electronic device of claim 2, wherein the tamper resistant thermal element is adapted to experience damage when the at least one component is removed, and wherein the damage changes the monitored thermal profile.

4. The portable electronic device of claim 1, further comprising a reference element for directly coupling the heat generating component to the thermal sensor.

5. The portable electronic device of claim 4, wherein the reference element is thermally isolated from the battery.

6. The portable electronic device of claim 1, wherein at least a portion of the thermal element is provided integrally as part of an authorized battery, and wherein the absence of at least that portion of the thermal element is an indication that the battery is not an authorized battery.

7. The portable electronic device of claim 1, wherein the thermal element is located between the battery and a battery cover.

8. The portable electronic device of claim 1, wherein the battery is located between the thermal element and a battery cover.

9. The portable electronic device of claim 1, wherein the battery is thermally coupled to the thermal element between the heat generating component and the thermal sensor.

10. The portable electronic device of claim 1, wherein the temperature sensor is a thermistor.

11. The portable electronic device of claim 1, wherein the heat generating component is a charger.

12. A portable electronic device, comprising:
a heat generating component;
a thermal sensor;
an energy storage device for powering the portable electronic device;
a thermal element thermally coupled to the heat generating component, the energy storage device, and the thermal sensor, the thermal element sized and shaped so that heat generated by the heat generating component flows through the thermal element towards the thermal sensor and interacts with the energy storage device; and
a processor operationally coupled to the thermal sensor to monitor a thermal profile for the thermal element, the processor configured to compare the monitor thermal profile with an expected thermal profile to determine if the integrity of the portable electronic device has been compromised.

13. The portable electronic device of claim 12, wherein the thermal element is coupled to at least one component and is tamper resistant to indicate when that component has been removed.

14. The portable electronic device of claim 11, wherein the tamper resistant thermal element is adapted to experience damage when the at least one component is removed, and wherein the damage changes the monitored thermal profile.

15. The portable electronic device of claim 14, wherein the tamper resistant thermal element is coupled to a non-removable component.

16. The portable electronic device of claim 15, wherein the non-removable component is a battery cover.

17. The portable electronic device of claim 15, wherein the non-removable component is the energy storage device.

18. The portable electronic device of claim 12, wherein at least a portion of the thermal element is provided integrally as part of an authorized energy storage device, and wherein the absence of at least that portion of the thermal element is an indication that the energy storage is not an authorized energy storage device.

19. A method of monitoring the integrity of a portable electronic device comprising a thermal sensor, a thermal element, a heat generating source and an energy storage device, the method comprising:
obtaining an expected thermal profile;
monitoring a thermal profile using the thermal sensor in thermal contact with the thermal element to obtain a monitored thermal profile for the thermal element, the thermal element thermally coupled to the heat generating source and the energy storage device; and
comparing the monitored thermal profile with the expected thermal profile to determine whether the integrity of the portable electronic device has been compromised;
wherein comparing the monitored thermal profile includes determining whether the monitored thermal profile is between an upper threshold and a lower threshold for the expected thermal profile, and
wherein comparing the monitored thermal profile includes obtaining a reference temperature from a reference element that is coupled to the thermal sensor and the heat generating component and is thermally isolated from the energy storage device.

* * * * *